(12) United States Patent
Matsumiya et al.

(10) Patent No.: US 7,812,377 B2
(45) Date of Patent: Oct. 12, 2010

(54) SEMICONDUCTOR DEVICE

(75) Inventors: Yoshiaki Matsumiya, Gunma (JP); Mitsuo Hatamoto, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 49 days.

(21) Appl. No.: 12/146,004

(22) Filed: Jun. 25, 2008

(65) Prior Publication Data

US 2009/0026506 A1 Jan. 29, 2009

(30) Foreign Application Priority Data

Jul. 27, 2007 (JP) .............................. 2007-195818

(51) Int. Cl.
*H01L 27/098* (2006.01)

(52) U.S. Cl. ...................... 257/272; 348/315

(58) Field of Classification Search .................. 257/272; 348/315
See application file for complete search history.

(56) References Cited

U.S. PATENT DOCUMENTS 6,264,167 B1 * 7/2001 Hamazawa .................. 251/288
6,740,907 B2 * 5/2004 Sakamoto .................... 257/134
7,002,192 B2 * 2/2006 Ku et al. ...................... 257/202
7,449,762 B1 * 11/2008 Singh .......................... 257/493
2006/0255403 A1 * 11/2006 Asano et al. ................. 257/335

FOREIGN PATENT DOCUMENTS

JP 8-227900 9/1996

OTHER PUBLICATIONS

Hatfield, C.W. et al. (1998). "DC I-V Characteristics and RF Performance of a 4H-SiC JFET at 773 K," *IEEE Transactions on Electron Devices.* 45.(9):2072-2074.

* cited by examiner

*Primary Examiner*—W. David Coleman
*Assistant Examiner*—Christine Enad
(74) *Attorney, Agent, or Firm*—Morrison & Foerster LLP

(57) ABSTRACT

In the semiconductor device, a gate region is formed in a mesh pattern having first polygonal shapes and second polygonal shapes the area of which is smaller than that of the first polygonal shapes, and drain regions and source regions are disposed within the first polygonal shapes and the second polygonal shapes, respectively. With this configuration, the forward transfer admittance gm can be increased as compared with a structure in which gate regions are disposed in a stripe pattern. Furthermore, compared with a case in which a gate region is disposed in a grid pattern, deterioration in forward transfer characteristics (amplification characteristics) due to an increase in input capacitance Ciss can be minimized while a predetermined withstand voltage is maintained.

6 Claims, 6 Drawing Sheets

Prior Art

Prior Art

Prior Art

SEMICONDUCTOR DEVICE

This application claims priority from Japanese Patent Application Number JP 2007-195818 filed on Jul. 27, 2007, the content of which is incorporated herein by reference in its entirety.

BACKGROUND OF THE INVENTION

1. Field of the Invention

The present invention relates to a semiconductor device used in a high frequency device, and particularly relates to a semiconductor device having a reduced chip size and improved high frequency characteristics.

2. Description of the Related Art

FIG. 4 illustrates an example of a junction field effect transistor (hereinafter, referred to as J-FET) used in high frequency devices.

FIG. 4 is a plan view showing a J-FET 200. The J-FET 200 has active regions 35 provided on a semiconductor substrate 20 forming a semiconductor chip. The active regions 35 are isolated by an isolation region 23. In this example, the two active regions 35 are provided, and both have the same configuration.

The active regions 35 each have the following configuration. Specifically, source regions, drain regions, and gate regions 27 are provided in a channel region 24, in a stripe pattern. Source electrodes 29 and drain electrodes 30 are respectively provided on and connected to the source regions and the drain regions. A source pad electrode 29p and a drain pad electrode 30p are respectively provided outside the active regions 35, and are respectively connected to the source regions and the drain regions. This technology is described for instance in Japanese Patent Application Publication No. Hei 8-227900 (p. 2 and FIG. 6).

FIGS. 5A and 5B are respectively a cross-sectional view of the cross section taken along the line c-c in FIG. 4 and an enlarged plan view of the active region 35. FIG. 5A illustrates a single set of the source region 25, the gate region 27, and the drain region 26, and an electrode layer formed on surfaces of these regions is omitted in FIG. 5B.

As shown in FIG. 5A, the semiconductor substrate 20 is obtained, for example, by stacking a p type semiconductor layer 22 on a p type silicon semiconductor substrate 21. A channel region 24 is provided on a surface of the semiconductor substrate 20, the channel region 24 being obtained by isolating an n type semiconductor region with the isolation region 23, which is a heavily-doped p type impurity region. In the n type channel region 24, the n+ type source region 25 and the n+ type drain region 26 are provided in a stripe pattern. Between the source region 25 and the drain region 26, the gate region 27 is formed in a stripe pattern. Here, conductivity types such as p+, p and p− belong in one general conductivity type, and conductivity types such as n+, n and n− belong in another general conductivity type.

The J-FET 200 is used, for example, at a gate-source voltage Vgs of 10 mV to 30 mV and a drain-source voltage Vds of 2 V.

In such a case, in the J-FET having the source region 25, the drain region 26, and the gate region 27 arranged in the stripe pattern, the source region 25, the drain region 26, and the gate region 27 are often disposed so that a distance between the gate region 27 and the drain region 26 (hereinafter, G-D distance L21) can be larger than a distance between the gate region 27 and the source region 25 (hereinafter, G-S distance L22), as shown in FIG. 5B.

A large bias voltage is applied between the gate region 27 and the drain region 26 compared to that applied between the gate region 27 and the source region 25. Accordingly, a width d1 of a depletion layer expanding from the gate region 27 toward the drain region 26 results in being larger than a width d2 of a depletion layer expanding from the gate region 27 toward the source region 25.

In short, a pattern in which the G-D distance L21 is larger than the G-S distance L22 is used so that expansion of the depletion layer d may not be interfered.

One of the essential parameters of the J-FET is forward transfer admittance gm. The forward transfer admittance gm is proportional to a gate width. In other words, to increase the forward transfer admittance gm, a large gate width is needed, and, consequently, the length of the gate region 27 disposed in the channel region 24 needs to be increased.

FIG. 6 illustrates a J-FET 200' in which gate regions 27 are disposed in a grid pattern. Sets of parallel gate regions 27 intersect to form the grid pattern. Source regions 25 and drain regions 26 spaced from each other and each provided as an island are disposed respectively in portions of channel region 24, the portions being surrounded by the gate regions 27. In this grid pattern, the source regions 25 and the drain regions 26 are alternately disposed in matrix in order to dispose source electrodes 29 and drain electrodes 30 as shown by the dashed lines.

Assuming that the area of the single channel region 24 (hereinafter, referred to as box B) isolated as an island by an isolation region 23 in this case is equal to that of the single channel region 24 in the case where the gate region 27 is disposed in the stripe pattern as shown in FIGS. 4 and 5. Then, the gate width can be approximately doubled in this case, compared with the case shown in FIGS. 4 and 5.

However, in this case, at least the gate regions 27 extending in the same direction need to be disposed at an equal interval "a". Accordingly, since the source regions 25 and the drain regions 26 are alternately disposed as described above, a G-D distance L21' and a G-S distance L22' cannot be different, unlike the case employing the stripe pattern. Thus, since the withstand voltage depends on the G-D distance L21', it is necessary to enlarge the area of the box B in order to ensure a predetermined withstand voltage.

Since the J-FET 200' of the above-described configuration has a back gate structure (see FIG. 5A), the area of the box B is a junction area of a p type back gate region (p type semiconductor layer 22) and the n type channel region 24. Accordingly, an increase in the area of the box B leads to an increase in gate junction capacitance, and an increase in input capacitance Ciss consequently causes deterioration in switching characteristics.

SUMMARY OF THE INVENTION

The invention provides a semiconductor device that includes a semiconductor substrate of a first general conductivity type configured to operate as a back gate region, a channel region of a second general conductivity type disposed on the front surface of the semiconductor substrate, and a gate region of the first general conductivity type formed in the surface portion of the channel region so as to form a mesh pattern having first mesh cells and second mesh cells. Each of the first and second mesh cells surrounds a portion of the channel region, the first mesh cell is a first polygon and the second mesh cell is a second polygon that is smaller than the first polygon, and each first mesh cell is disposed next to a corresponding second mesh cell. The device also includes a plurality of source regions formed in corresponding portions of the channel region surrounded by the gate region, and a plurality of drain regions formed in corresponding portions of the channel region surrounded by the gate region.

DESCRIPTION OF THE INVENTION

Hereinbelow, with reference to FIGS. 1 to 3, an embodiment of the invention will be described by using a junction field effect transistor (J-FET) as an example.

Figure 1:
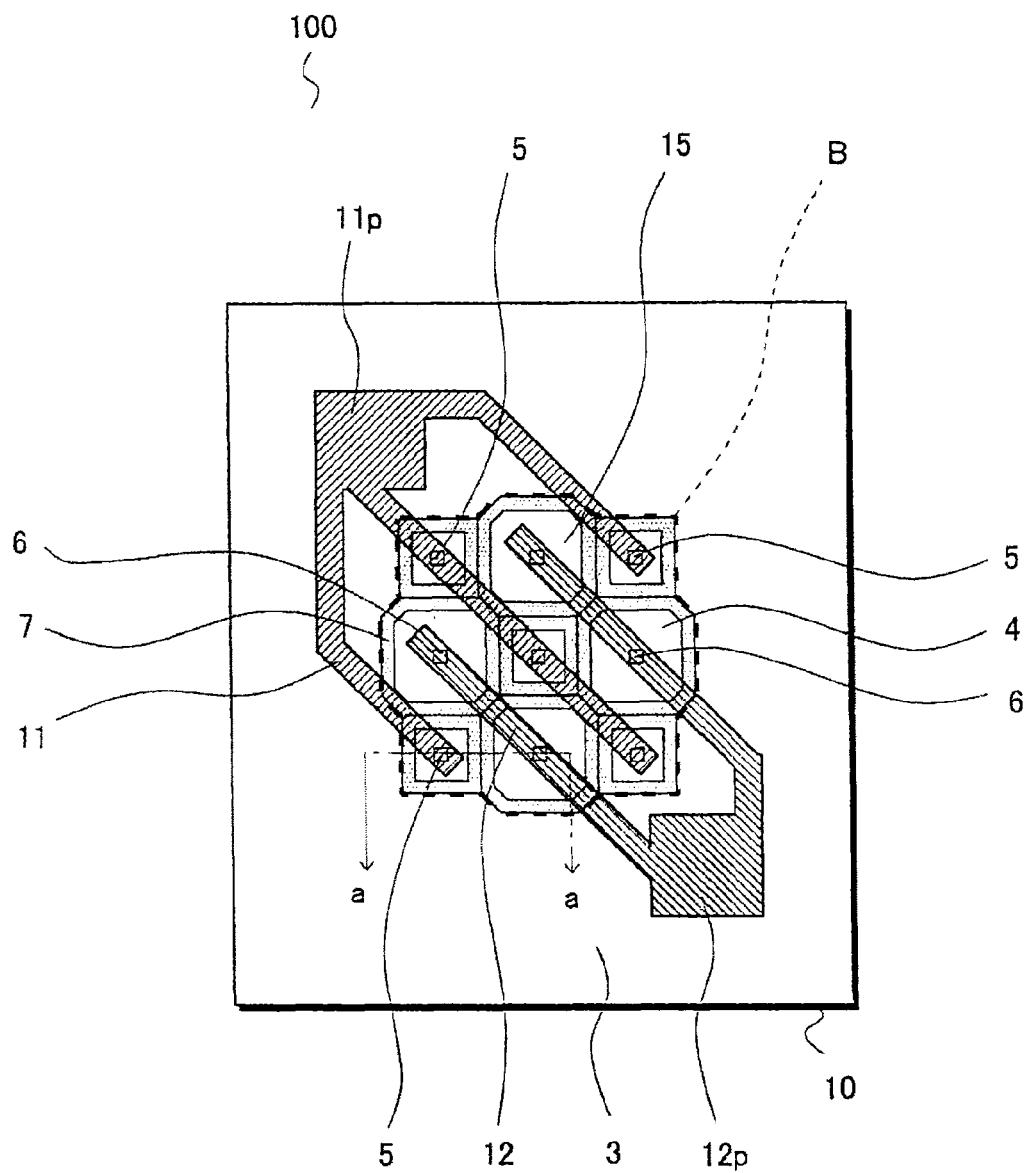
FIG. 1 is a plan view for illustrating an embodiment of the present invention.

FIG. 1 is a plan view illustrating a J-FET 100 according to the embodiment.

The J-FET 100 according to this embodiment includes a semiconductor substrate 1 of one conductivity type, a channel region 4, a gate region 7, source regions 5, and drain regions 6.

The J-FET 100 has an active region 15 provided on the p type semiconductor substrate 1 forming a single chip, and serving as a back gate region. Here, although a single active region 15 is provided as an example, a plurality of active regions 15 may be provided.

The active region 15 collectively refers to the channel region 4, the gate region 7, the source regions 5, the drain regions 6, as well as source electrodes 11 and drain electrodes 12 provided on and connected to the source regions 5 and the drain regions 6, respectively. In this embodiment, the active region 15 is defined to have the same area as the channel region 4 divided to form an island by an isolation region 3 (i.e. the area surrounded by the dashed line in FIG. 1). In addition, hereinafter, a single area of the channel regions 4 (active region 15) is referred to as a box B. When a plurality of active regions 15 are provided, the active regions 15 are divided by the isolation region 3.

The source electrodes 11 and the drain electrodes 12 each extend in the directions of a diagonal line of the chip (semiconductor substrate 1) or in the directions parallel to the diagonal line. Moreover, each of the source electrodes 11 is connected to the corresponding source region 5, and each of the drain electrodes 12 is connected to the corresponding drain region 6, through a contact hole provided in an insulating film (not shown) covering a surface of the corresponding channel region 4.

The source electrodes 11 and the drain electrodes 12 are respectively connected to a source pad electrode 11p and a drain pad electrode 12p, which are provided outside the active region 15.

Figure 2:
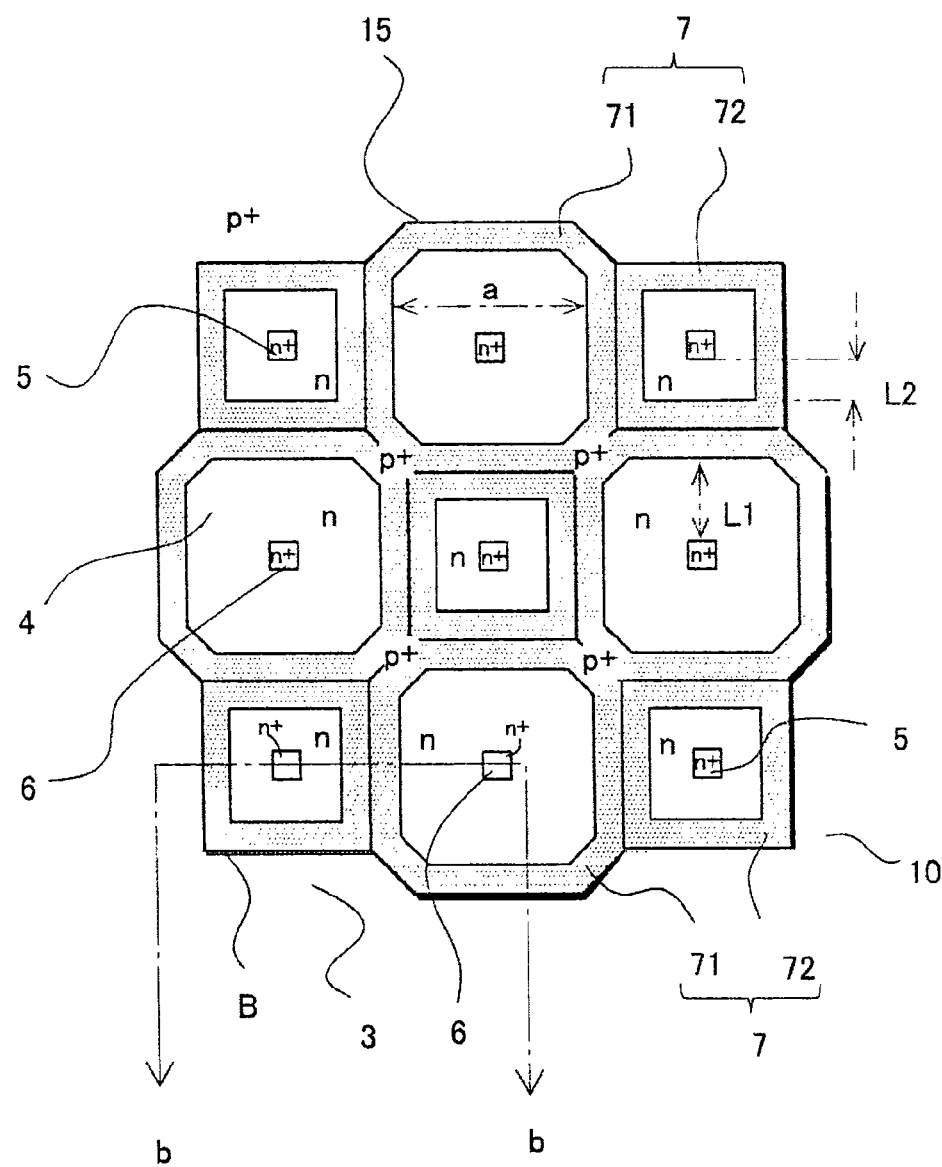
FIG. 2 is a plan view for illustrating the embodiment of the present invention.

FIG. 2 is a plan view illustrating the active region 15 formed within the box B. In FIG. 2, a conductive layer, the insulating film, and an electrode layer (the source electrodes and the drain electrodes) on surfaces of the regions are omitted.

As shown in FIG. 2, an n type channel region 4 is provided on a surface of the p type semiconductor substrate 1 serving as a back gate region. The channel region 4 is divided by the isolation region 3 as the box B. The isolation region 3 is a heavily doped p type impurity region.

The gate region 7 is disposed in a surface of the channel region 4. The gate region 7 has a mesh pattern. The mesh pattern is continuous within the box B.

The mesh pattern is formed of first polygons 71 and second polygons 72 disposed alternately, the second polygons being smaller than the first polygons. More specifically, the first polygons are each an octagon (hereinafter, octagonal pattern 71), and the second polygon are each a quadrilateral (hereinafter, quadrilateral pattern 72). The ratio of the area of the octagonal pattern 71 to the area of the quadrilateral pattern 72 is, for example, approximately 2.3:1.

In other words, the mesh pattern includes a first type of mesh cell that is defined by the shaded square 71 shown in FIG. 2 and a second type of mesh cell that is defined by the shaded octagon 71 shown in FIG. 2. By putting the sides of the polygons together, the mesh pattern of the gate region is formed.

The octagonal pattern 71 is formed, for example, of four long sides (the length is 19.2 µm, for example) and four short sides (the length is 6.1 µm, for example). The four long sides are respectively adjacent to the four quadrilateral patterns 72 around the octagonal pattern 71, and the four short sides are respectively adjacent to other four octagonal patterns 71 disposed therearound.

The quadrilateral pattern 72 is a quadrilateral of which four sides have an equal length. Accordingly, the four sides of the quadrilateral pattern 72 are adjacent only to the octagonal patterns 71 disposed around the quadrilateral pattern 72.

Thereby, the octagonal patterns 71 and the quadrilateral patterns 72 are alternately disposed in matrix.

The source region 5 and the drain region 6 are provided as an island in surfaces of the parts of the channel region 4, the parts being surrounded by the gate region 7. Specifically, the drain regions 6 are provided approximately in the centers of the octagonal patterns 71, respectively, and the source regions 5 are provided approximately in the centers of the quadrilateral patterns 72. The source regions 5 and the drain regions 6 are alternately disposed in matrix. The source regions 5 and the drain regions 6 each have the same area.

Such a configuration makes a distance L1 from the drain region 6 to a closest portion of the gate region 7 larger than a distance L2 from the source region 5 to a closest portion of the gate region 7.

Figure 3A:
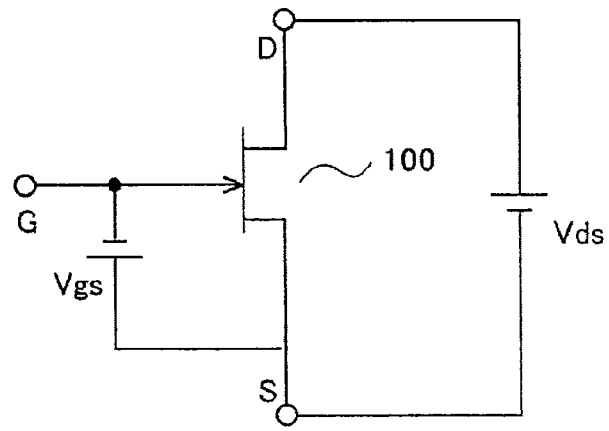
FIG. 3A is a circuit diagram.
Figure 3B:
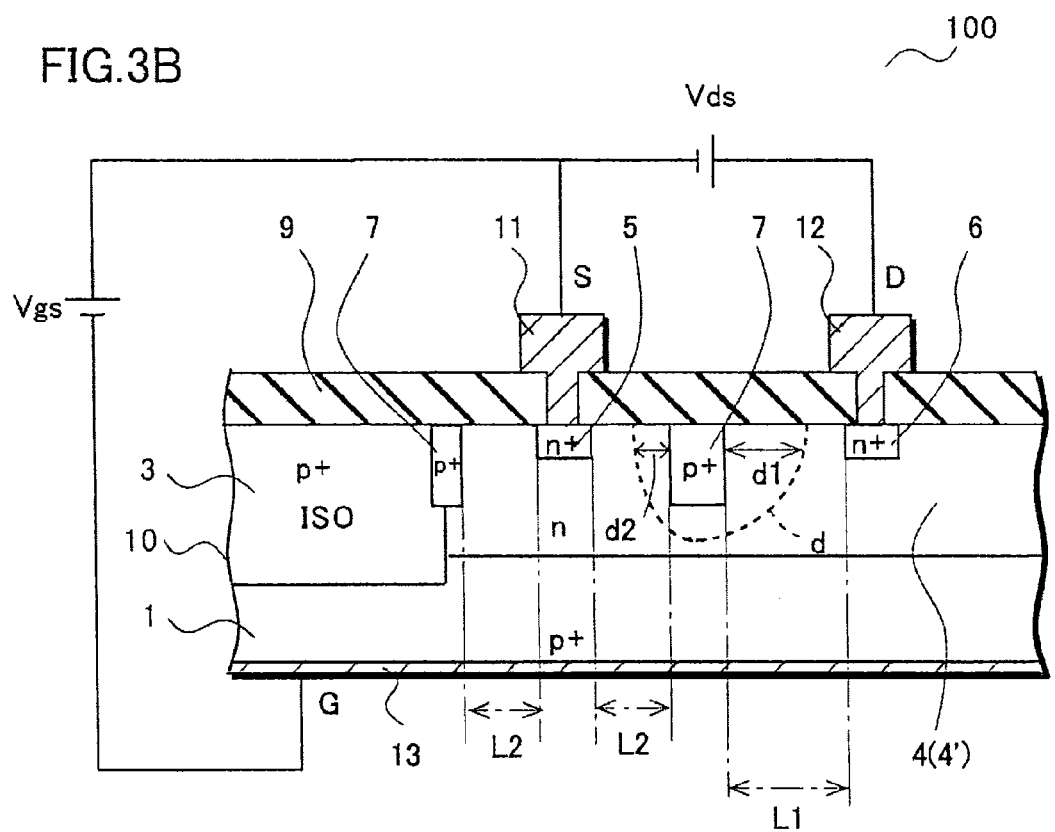
FIG. 3B is a cross-sectional view, for illustrating the embodiment of the present invention.

FIG. 3A is a circuit diagram illustrating an example of use of the J-FET 100 according to this embodiment, and FIG. 3B is a cross-sectional view taken along the line a-a of FIG. 1 and the line b-b of FIG. 2.

In FIG. 3A, the J-FET 100 is used, for example, at a gate-source voltage Vgs of 10 mV to 30 mV and a drain-source voltage Vds of 2 V.

With reference to FIG. 3B, a substrate 10 has the channel region 4 provided in the surface of the p type silicon semiconductor substrate 1 (hereinafter, p+ type semiconductor substrate). The channel region 4 is a region obtained by selectively implanting ions of an n type impurity into the surface of the p+ type semiconductor substrate 1 and diffusing the n type impurity therein, a region obtained by stacking an n type semiconductor layer 4' by epitaxial growth or the like. The channel region 4 has an impurity concentration of approximately $1.0E14$ cm$^{-3}$, for example.

The channel region 4 is formed as an island by the isolation region 3 that reaches to the p+ type semiconductor substrate 1, and forms a box B. The bottom of the channel region 4 forms a pn junction with the p+ type semiconductor substrate 1 provided as the back gate region.

The gate region 7 is a p type impurity diffusion region provided between each of the source regions 5 and each of the drain regions 6 in the channel region 4. Preferably, the gate region 7 has an impurity concentration of approximately $2E18$ cm$^{-3}$.

The gate region 7 extends to a portion of the isolation region 3 provided outside the channel region 4. The gate region 7 is electrically connected with a gate electrode 13 provided on a back face of the p+ type semiconductor substrate 1, through the isolation region 3 and the p+ type semiconductor substrate 1.

In the J-FET 100 having the above-described back gate structure, gate capacitance is determined by the area of the base of the single box B and a junction area of the channel region 4 and the gate region 7 provided in the channel region 4.

The source regions 5 and the drain regions 6 are each formed by implanting ions of an n type impurity into the surface of the channel region 4 and diffusing the n type impurity therein. The source region 5 is disposed on one side of the gate region 7 and the drain region 6 is disposed on the other side of the gate region 7. The source regions 5 and the drain regions 6 are disposed in matrix so that the source regions 5 and the drain regions 6 spaced from each other and disposed as an island may be respectively connected to the source electrodes forming a stripe shape and the drain electrodes forming a stripe shape.

With reference to FIG. 1, an insulating film 9 is provided on the surface of the substrate 10, and the source electrodes 11 forming the stripe shape and drain electrode 12 forming the stripe shape are provided to overlap the source regions 5 and the drain regions 6, respectively. The source electrodes 11 and the drain electrodes 12 are respectively in contact with the source regions 5 and the drain regions 6 through the contact holes provided in the insulating film 9.

The source electrodes 11 extend in the directions of a diagonal line of the chip(box) and in directions parallel to the diagonal line, and are in contact with the source regions 5 through the contact holes provided in the insulating film 9 covering the surface of the substrate 10. The source regions 5 are provided as islands in the directions of the diagonal line of the chip (box) and in the directions parallel to the diagonal line. Several of the source regions 5 are connected to each of the source electrodes 11.

The drain electrodes 12 also extend in the directions of the diagonal line of the chip (box) and in directions parallel to the diagonal line, and are in contact with the drain regions 6 through the contact holes provided in the insulating film 9 covering the surface of the substrate 10. The drain regions 6 are provided as islands in the directions of the diagonal line of the chip (box) and in the directions parallel to the diagonal line. Several of the drain regions 6 are connected to each of the drain electrodes 12.

The source electrodes 11 are connected to a source pad electrode 11p to form a comb shape, and the drain electrodes 12 are connected to a drain pad electrode 12p to form a comb shape. The source electrodes 11 and the drain electrodes 12 are disposed so that the comb teeth of the source electrodes 11 may be engaged with the comb teeth of the drain electrodes 12. However, the layout and pattern of the source pad electrode 11p and the drain pad electrode 12p are not limited to those shown.

Since the bias voltage applied between the gate region 7 and the drain region 6 is larger than that applied between the gate region 7 and the source region 5 in general use of the J-FET 100, a width d1 of a depletion layer expanding in the direction from the gate region 7 to the drain region 6 needs to be larger than a width d2 of a depletion layer expanding in the direction from the gate region 7 to the source region 5 (FIG. 3B).

In this embodiment, as shown in FIG. 2, the mesh pattern having the octagonal patterns 71 and the quadrilateral patterns 72 alternately disposed is used as a pattern of the gate region 7 in the surface of the channel region 4. Then, the drain region 6 is disposed approximately in the center of the octagonal pattern 71, and the source region 5 is disposed approximately in the center of the quadrilateral pattern 72. The area of the octagonal pattern 71 is larger than that of the quadrilateral pattern 72. Such an arrangement can ensure a closest distance from the drain region 6 to the gate region 7 (hereinafter, gate-drain distance L1) larger than a closest distance from the gate region 7 to the source region 5 (hereinafter, gate-source distance L2).

Figure 6:
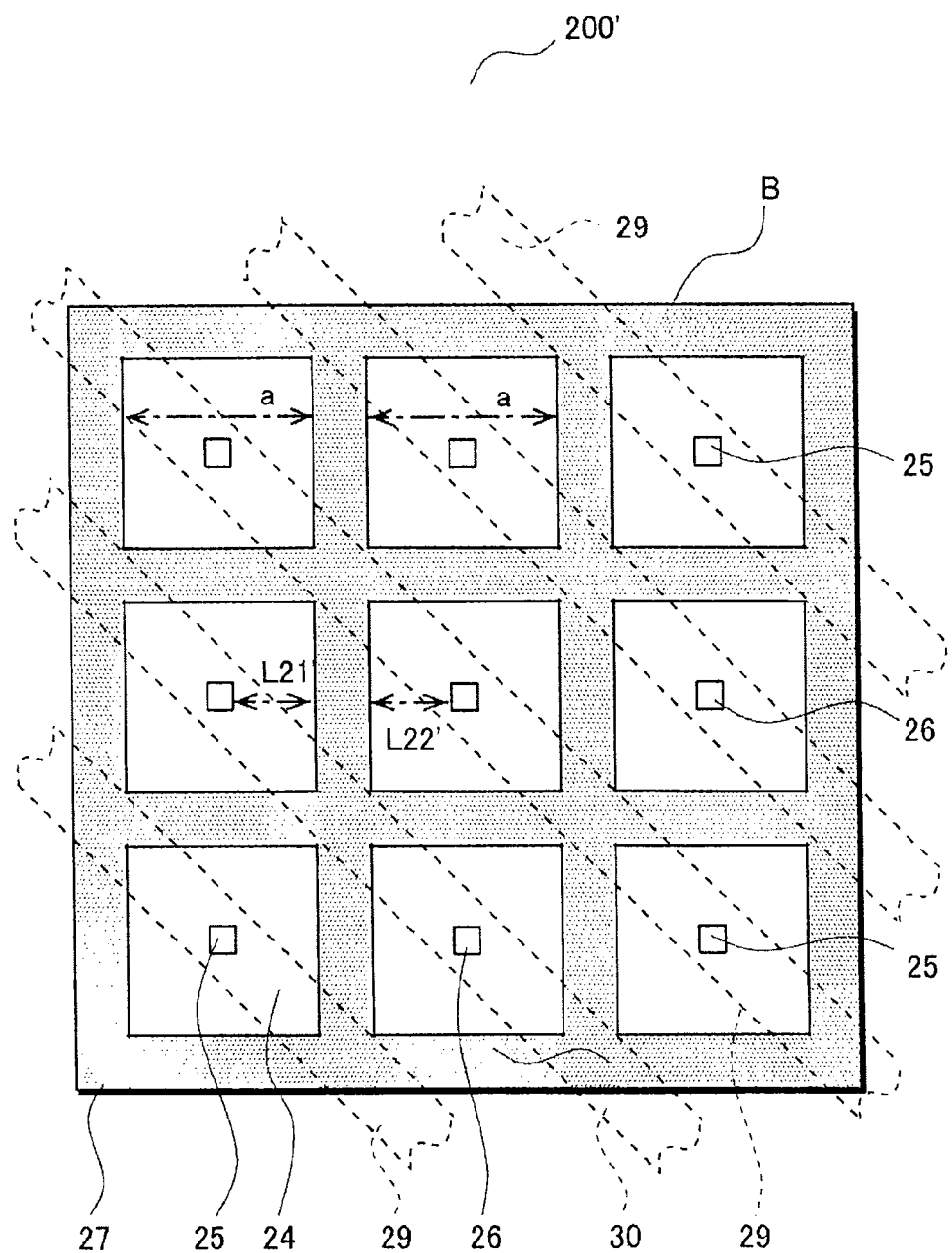
FIG. 6 is a plan view for illustrating another conventional structure.

As mentioned above, the structure having the gate regions 27 disposed in the grid pattern as shown in FIG. 6 is effective in increasing the gate widths to improve the forward transfer admittance gm. In this case, the source regions 25 and the drain regions 26 are alternately disposed in matrix. Furthermore, the source electrodes 29 in a stripe shape and the drain electrodes 30 in a stripe shape connected with the source regions 25 and the drain regions 26 are disposed such that comb teeth are engaged.

Accordingly, when the gate regions 27 having a stripe shape are disposed parallel and in the grid pattern, the G-D distance L21' results in being equal to the G-S distance L22'. The G-D distance L21' is equal to the G-S distance L22 even when an interval at which the gate regions 27 are disposed in a longitudinal direction is different from an interval at which the gate regions 27 are disposed in a lateral direction in FIG. 6. Hence, the pattern in which the source regions 25 and the drain regions 26 are alternately disposed in matrix makes the G-D distance L21' and the G-S distance L22' equal.

Accordingly, since the width d1 of the depletion layer between the drain region 26 and the gate region 27 is larger than the width d2 of the depletion layer between the source region 25 and the gate region 27, the withstand voltage is determined by the G-D distance L21', which leads to a problem that the box area increases according to the G-D distance L21'. Since the junction capacitance between the p type back gate region and the n type channel region corresponds to the box area, an increase in the box area causes an increase in the gate junction capacitance.

In addition, when the gate regions 27 are disposed in the grid pattern, the junction area between the channel region 24 and the gate regions 27 in the channel region 24 increases compared with the pattern in which the gate regions 27 are disposed in the stripe pattern, which leads to an increase in gate capacitance.

Accordingly, an increase in the box area causes an increase in the input capacitance Ciss, and the forward transfer characteristics (amplification characteristics) deteriorate.

On the other hand, in this embodiment, the gate region 7 has the mesh pattern formed of the octagonal patterns 71 and the quadrilateral patterns 72 smaller than the octagonal patterns 71. Thereby, the G-D distance L1 can be made different from the G-S distance L2 even when the source regions 5 and the drain regions 6 are alternately disposed in matrix.

Figure 4:
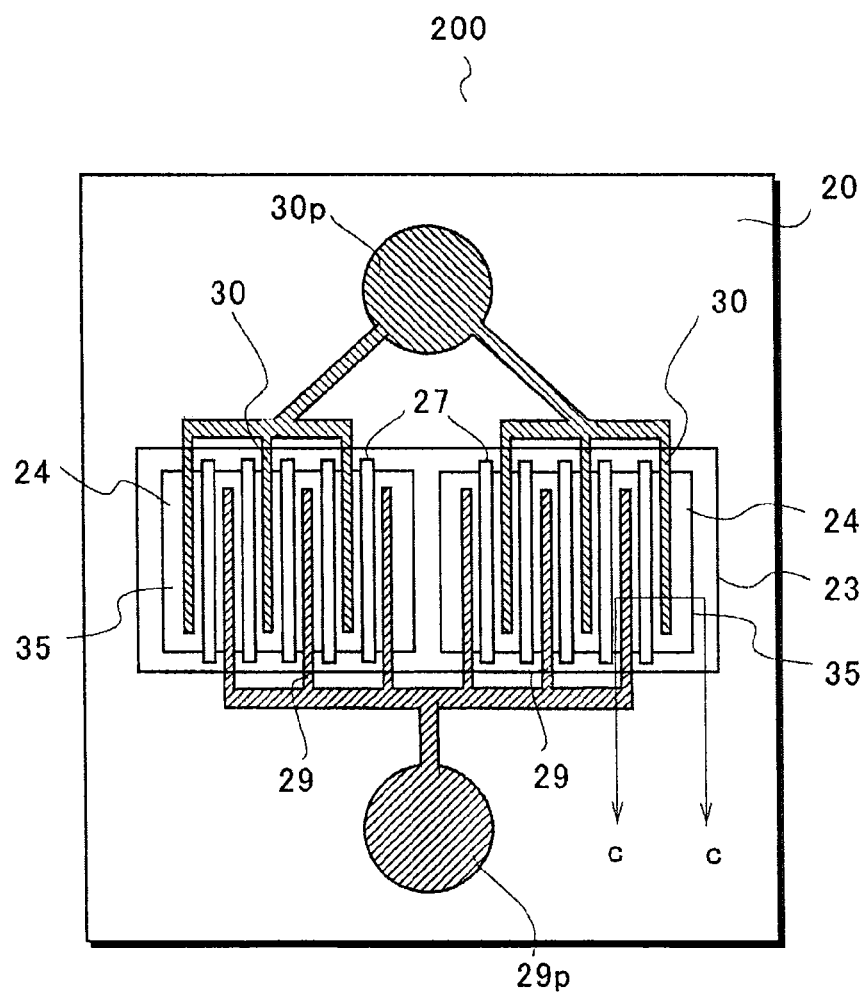
FIG. 4 is a plan view for illustrating a conventional structure.
Figure 5A:
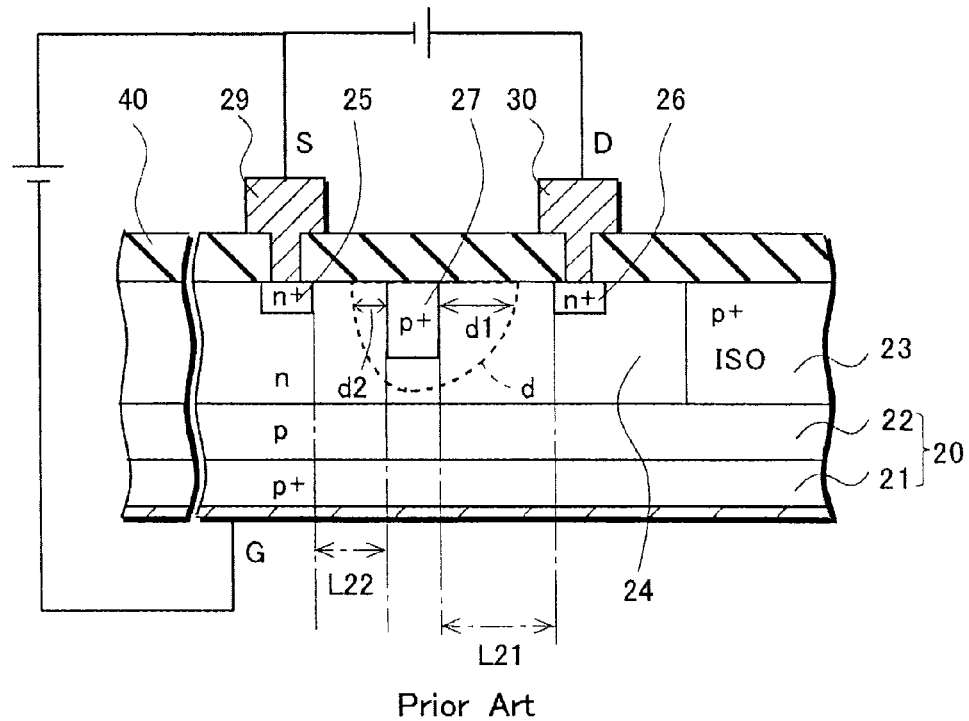
FIG. 5A is a cross-sectional view.
Figure 5B:
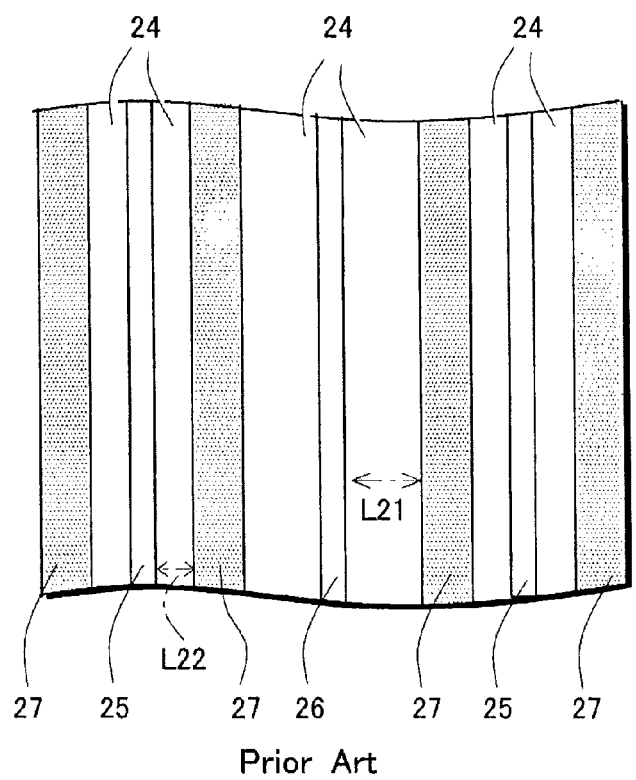
FIG. 5B is a plan view, for illustrating the conventional structure.

In addition, the gate region 7 formed in the mesh pattern can increase the gate width (length of the gate region 7), and hence, can improve the forward transfer admittance gm, compared with the conventional structure (FIG. 4) in which the gate regions 27 are disposed in the stripe pattern.

In other words, in this embodiment, an increase in the box area can be minimized by the use of the mesh pattern in which the gate width increases to improve the forward transfer admittance gm. Specifically, suppose that the grids of the gate regions 27 in FIG. 6 are each a quadrilateral, and a distance "a" between the gate regions 27 facing each other is equal to a distance "a" between the portions of the gate region 7 having the octagonal pattern 71 of this embodiment, the portions being facing each other. In such a case, the box area can be reduced by approximately 31% according to this embodiment, When the gate width in the pattern of this embodiment illustrated in FIG. 2 is compared with that in the pattern illustrated in FIG. 6, under the above-mentioned condition, the box area of FIG. 2 is smaller, and the gate width of this embodiment (FIG. 2) is thus smaller. However, when the pattern of FIG. 2 has the same box area as the box area in the pattern of FIG. 6, the gate width of this embodiment (FIG. 2) is larger.

Furthermore, in comparison with the conventional structure (FIG. 4) in which the box size is equal to that in the pattern of FIG. 6 and the gate regions 27 are disposed in the stripe pattern, the gate width can be increased by approximately 56%, and the forward transfer admittance gm is thus increased in this embodiment. Specifically, the forward transfer admittance gm is 1.4 mS in the pattern of FIG. 4, while increasing to 1.6 mS according to this embodiment.

Hence, while the pattern having the improved forward transfer admittance gm is provided, the predetermined withstand voltage can be maintained with minimal deterioration in the forward transfer characteristics (amplification characteristic) due to an increase in the gate capacitance (input capacitance Ciss).

As described in detail above, according to the above-described embodiment of the present invention, the following effects can be obtained.

Firstly, the gate region has the mesh pattern formed of the first polygons and the second polygons alternately disposed, the second polygons being smaller than the first polygons, and the source regions and the drain regions are each provided in the surface of the channel region surrounded by the gate region. Such a configuration allows an increase in the gate width and improvement in the forward transfer admittance gm, compared with the J-FET having the same box area as this embodiment and the gate regions disposed in the stripe pattern.

Secondly, in the mesh pattern, the drain region is disposed within the first polygon, and the source region is disposed within the second polygon. In addition, the distance from the drain region to the closest portion of the gate region is provided to be larger than the distance from the source region to the closest portion of the gate region. Such a configuration allows the distance between the drain region and the gate region, where the width of the depletion layer is larger, to be larger than that between the source region and the gate region, where the width of the depletion layer is smaller. Consequently, an increase of the input capacitance Ciss due to an increase in the box area can be minimized while the predetermined withstand voltage is maintained.

Thirdly, octagons are used as the first polygons, and quadrilaterals are used as the second polygons. Such a configuration allows the first polygons and the second polygons to be disposed alternately and adjacent to each other. Moreover, the drain regions disposed within the first polygons and the source regions disposed within the second polygons can each be aligned in the diagonal directions of the box.

Hence, in the same manner as in the case where the gate regions are disposed in the grid pattern, the source electrodes connected to the source regions and the drain electrodes connected to the drain regions can be extended in the diagonal directions of the box, which allows each of the electrodes to have contact to corresponding regions.

What is claimed is:

1. A semiconductor device comprising:
    a semiconductor substrate of a first general conductivity type configured to operate as a back gate region;
    a channel region of a second general conductivity type disposed on a front surface of the semiconductor substrate;
    a gate region of the first general conductivity type formed in a surface portion of the channel region so as to form a mesh pattern comprising first mesh cells and second mesh cells, each of the first and second mesh cells surrounds a portion of the channel region, the first mesh cell being a first polygon and the second mesh cell being a second polygon that is smaller than the first polygon, each first mesh cell being disposed next to a corresponding second mesh cell, and the gate region being electrically connected to the back gate region;
    a plurality of source regions formed in corresponding second mesh cells; and
    a plurality of drain regions formed in corresponding first mesh cells,
    wherein the source regions are separated from the gate region at least by a first distance, and the drain regions are separated from the gate region at least by a second distance that is larger than the first distance.

2. The semiconductor device of claim 1, wherein each of the first mesh cells is in contact with at least two second mesh cells, and each of the second mesh cells is in contact with at least two first mesh cells.

3. The semiconductor device of claim 1, wherein the first polygon comprises a first side and a second side shorter than the first side, and the first side is in contact with the second polygon and the second side is in contact with a second side of another first polygon.

4. The semiconductor device of claim 1, wherein the first polygon is a octagon, and the second polygon is a square.

5. The semiconductor device of claim 1, further comprising a drain electrode disposed on the front surface of the semiconductor substrate and connecting the drain regions, a source electrode disposed on the front surface of the semiconductor substrate and connecting the source regions, and a gate electrode disposed on a back surface of the semiconductor substrate so as to be connected to the back gate region.

6. The semiconductor device of claim 5, wherein the drain electrode and the source electrode each have a comb shape.

* * * * *